United States Patent
Zhao et al.

(10) Patent No.: US 11,450,585 B2
(45) Date of Patent: Sep. 20, 2022

(54) ON-DIE THERMAL MANAGEMENT FOR VLSI APPLICATIONS

(71) Applicant: Innogrit Technologies Co., Ltd., Shanghai (CN)

(72) Inventors: Gang Zhao, Chandler, AZ (US); Lin Chen, Cupertino, CA (US); Zining Wu, Los Altos, CA (US); Wei Jiang, Fremont, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 186 days.

(21) Appl. No.: 17/086,604

(22) Filed: Nov. 2, 2020

(65) Prior Publication Data

US 2022/0139796 A1    May 5, 2022

(51) Int. Cl.
*H01L 23/34* (2006.01)
*G06F 1/20* (2006.01)

(52) U.S. Cl.
CPC ............ *H01L 23/345* (2013.01); *G06F 1/206* (2013.01); *H01L 23/34* (2013.01)

(58) Field of Classification Search
None
See application file for complete search history.

(56) References Cited

U.S. PATENT DOCUMENTS

| | | | | |
|---|---|---|---|---|
| 6,433,567 B1 * | 8/2002 | Okayasu | .......... | G01R 31/31922 219/209 |
| 9,148,910 B1 * | 9/2015 | Mimran | ................. | H05B 1/023 |
| 10,750,635 B2 * | 8/2020 | Wu | ......................... | G05B 15/02 |
| 2009/0198387 A1 * | 8/2009 | Lin | ........................... | G06F 1/26 713/2 |
| 2014/0122917 A1 * | 5/2014 | Chung | .................... | G06F 1/324 713/600 |
| 2020/0286804 A1 * | 9/2020 | Fallin | .................... | H01L 23/345 |

FOREIGN PATENT DOCUMENTS

WO    WO-2013140226 A2 *    9/2013    ........... H01L 23/345

* cited by examiner

*Primary Examiner* — Jason Lin
(74) *Attorney, Agent, or Firm* — IPRO, PLLC; Xiaomin Huang

(57) ABSTRACT

Apparatus and methods are provided for managing operations of a semiconductor chip. In an exemplary embodiment, there is provided a semiconductor chip that may comprise a temperature sensor, a thermal heater, a processor and thermal control logic. The thermal control logic may be configured to: determine that a first temperature read-out from the temperature sensor reaches a first temperature threshold value, turn on the thermal heater, determine that a second temperature read-out from the temperature sensor reaches a second temperature threshold value that is lower than the first temperature threshold value, suspend functions of the processor, determine that a third temperature read-out from the temperature sensor reaches the first temperature threshold value, resume the functions of the processor, determine that a fourth temperature read-out from the temperature sensor reaches a third temperature threshold value that is higher than the first temperature threshold value and turn off the thermal heater.

20 Claims, 3 Drawing Sheets

ON-DIE THERMAL MANAGEMENT FOR VLSI APPLICATIONS

TECHNICAL FIELD

The disclosure herein relates to thermal management for semiconductor dies, particularly relates to thermal management for Very Large Scale Integration (VLSI) Integrated Circuits (IC) and System On A Chip (SoC) applications.

BACKGROUND

In modern CMOS semiconductor technologies, the performance and reliability of integrated circuits have demonstrated great dependency on the temperature. On one hand, carrier mobility decreases with higher temperature which tends to slow down the circuit. On the other hand, the threshold voltage also decreases with higher temperature which may help speed up the circuit. When the effect of the threshold voltage reduction exceeds the carrier mobility decrease, the circuit will perform faster at higher temperature. This is known as the phenomenon of Temperature Inversion which has become increasingly common with the latest sub-micron CMOS technologies.

With the effect of Temperature Inversion, the integrated circuit becomes slower under lower temperature for the modern sub-micron CMOS technologies. As each circuit has a specification of temperature range, this often makes the lower temperature bound the most challenging corner for circuit development and timing sign-off. Depending on the applications, many circuits will stop at a lower temperature bound of 0° C., −10° C. or −40° C. Going for even lower temperature corner tends to increase the challenge of timing sign-off, delay development cycle, reduce the product performance and increase the die size and cost.

Nevertheless, there has been a continuing increase of demand for integrated circuits for low temperature applications. For example, automobile applications often require a lower temperature bound of −55° C. This leads to significant challenges for modern sub-micron CMOS technologies and barriers that prevent the adoption of the integrated circuits into those low temperature applications

SUMMARY

A continuing need exists for improved thermal management for Very Large Scale Integration (VLSI) Integrated Circuits (IC) and System On A Chip (SoC) applications. The present disclosure provides a novel circuit scheme that may implement and integrate a thermal heater module into a VLSI IC or SoC die. An exemplary system or method according to the present disclosure may take advantage of the on-die thermal heater to monitor the temperature and control the behavior of the SoC. This scheme may help stabilize the temperature of the SoC and prevents the temperature from dropping below certain low temperature during operation. As a result, the design cost of the SoC may be reduced with potentially smaller die size and shorter development cycle. In addition, the application of the SoC may be expanded into those extremely low temperature applications.

One exemplary embodiment according to the present disclosure may provide a semiconductor chip that may comprise a temperature sensor, a thermal heater, a processor and thermal control logic. The thermal control logic may comprise circuitry configured to: determine that a first temperature read-out from the temperature sensor reaches a first temperature threshold value, turn on the thermal heater, determine that a second temperature read-out from the temperature sensor reaches a second temperature threshold value that is lower than the first temperature threshold value, suspend functions of the processor, determine that a third temperature read-out from the temperature sensor reaches the first temperature threshold value, resume the functions of the processor, determine that a fourth temperature read-out from the temperature sensor reaches a third temperature threshold value that is higher than the first temperature threshold value and turn off the thermal heater.

In another exemplary embodiment, there is provided a method for operating a semiconductor chip. The method may comprise determining that a first temperature read-out from a temperature sensor on the semiconductor chip reaches a first temperature threshold value, turning on a thermal heater on the semiconductor chip, determining that a second temperature read-out from the temperature sensor reaches a second temperature threshold value that is lower than the first temperature threshold value, suspending functions of a processor on the semiconductor chip, determine that a third temperature read-out from the temperature sensor reaches the first temperature threshold value, resuming the functions of the processor, determining that a fourth temperature read-out from the temperature sensor reaches a third temperature threshold value that is higher than the first temperature threshold value and turning off the thermal heater.

DETAILED DESCRIPTION

Figure 1:
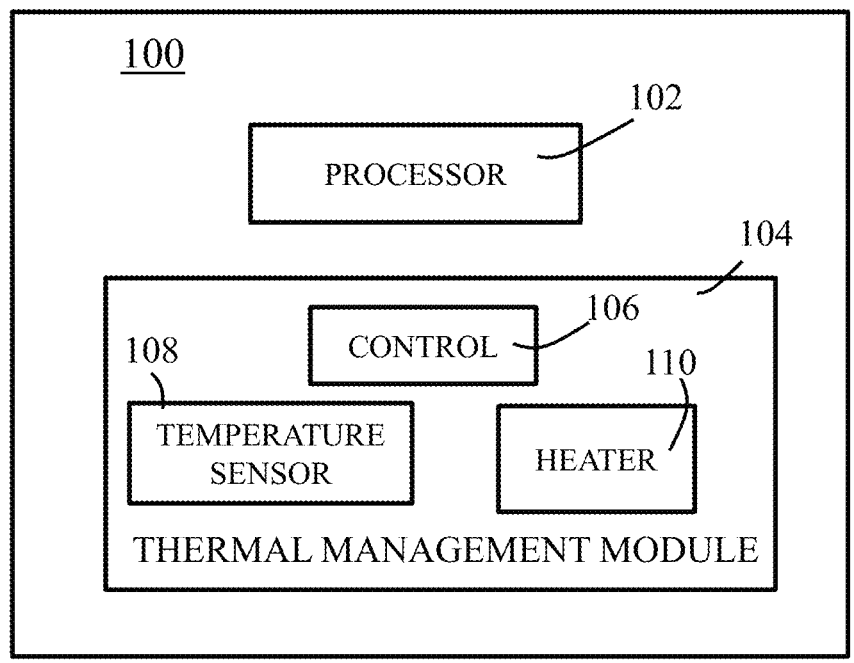
FIG. 1 schematically shows a system on a chip in accordance with an embodiment of the present disclosure.

Specific embodiments according to the present disclosure will now be described in detail with reference to the accompanying figures. Like elements in the various figures are denoted by like reference numerals for consistency.

FIG. 1 schematically shows a system on a chip (SoC) 100 in accordance with an embodiment of the present disclosure. The SoC 100 may be an integrated circuit (IC) semiconductor chip that may comprise a processor 102 and a thermal management module 104. The thermal management module 104 may comprise a thermal control logic block 106, a temperature sensor 108, and a thermal heater 110. The thermal control logic block 106 may comprise control logic circuitry and referred to as thermal control logic 106. In at least one embodiment, the thermal control logic 106 may be implemented with dedicated analog circuitry to ensure reliability and timing closure at extreme low temperatures. The thermal control logic 106 may be coupled to the temperature sensor 108 and configured to send a number of control signals to the temperature sensor 108 (e.g., to configurate and calibrate the temperature sensor 108) and receive the temperature read-outs from the temperature sensor 108.

The thermal control logic 106 may also be coupled to the thermal heater 110 and configured to control the thermal heater 110 (e.g., to turn it on and off). The thermal heater 110 may be a resistive structure that can generate heat by joule heating. In one embodiment, the thermal control logic 106 may control the thermal heater 110 with a number of control signals including, for example, an "Enable" signal. When the Enable signal is asserted, the thermal heater 110 may be turned on. When the Enable signal is de-asserted, the thermal heater 110 may be turned off.

The thermal control logic 106 may also be coupled to outside the thermal heater module 104. For example, thermal control logic 106 may be coupled to the processor 102. The processor 102 may configure the control of the thermal heater 110 by sending control and command signals to the thermal control logic 106. The thermal control logic 106 may also send out control signals to the processor 102. For example, the thermal control logic 106 may send signals to the processor 102 to let the processor 102 suspend or resume functions based on the temperature read-outs received by the temperature sensor 108.

The thermal control logic 106 may include circuitry that may be configured to compare the temperature read-outs received from the temperature sensor 108 to a number of threshold values. For example, thermal control logic 106 may include circuitry that may be configured to compare the temperature read-outs received from the temperature sensor 108 to a first threshold value, Ton. The thermal control logic 106 may continuously receive the temperature read-outs from the temperature sensor 108 and determine that, at a point, the temperature measured by the temperature sensor 108 may lower to reach the first threshold value Ton. In one embodiment, the measured temperature lowers to reach Ton when the measured temperature may have been above Ton and drop to or drop below Ton. In response to determining that the temperature lowers to reach the first threshold value Ton, the thermal control logic 106 may send a control signal to the heater 110 (e.g., asserting an "Enable" signal) to turn on the heater 110.

The thermal control logic 106 may also include circuitry that may be configured to compare the temperature read-outs received from the temperature sensor 108 to a second threshold value, Tr (e.g., Temperature RESET). The thermal control logic 106 may continuously receive the temperature read-outs from the temperature sensor 108 and determine that, at another point, the temperature measured by the temperature sensor 108 may lower to reach the second threshold value Tr. In one embodiment, the measured temperature lowers to reach Tr when the measured temperature may have been above Tr but drop to or drop below Tr. In response to determining that the temperature lowers to reach the second threshold value Tr, the thermal control logic 106 may send a signal (e.g., asserting a "RESET" signal or logic "zero") to the processor 102 to suspend the normal functions of the processor 102.

After the heater 110 may be turned on for a while, the temperature may start to rise. The thermal control logic 106 may continue monitoring the temperature read-outs from the temperature sensor 108. Once the thermal control logic 106 determines that the temperature measured by the temperature sensor 108 rises to reach the first temperature threshold Ton (e.g., equal to or higher than Ton), the thermal control logic 106 may send also send another signal (e.g., de-asserting the "RESET" signal) to the processor 102 to resume the normal functions of the processor 102.

The thermal control logic 106 may also include circuitry that may be configured to compare the temperature read-outs received from the temperature sensor 108 to a third threshold value, Toff. The thermal control logic 106 may continuously receive the temperature read-outs from the temperature sensor 108 and determine that, at yet another point, the temperature measured by the temperature sensor 108 rises to reach the third threshold value Toff. The thermal control logic 106 may send a control signal to the heater 110 (e.g., de-asserting "Enable" signal) to turn off the heater 110. In one embodiment, the thermal control logic 106 may determine that the measured temperature reaches Toff when the measured temperature may be either equal to or higher than Toff.

It should be noted that the thermal heater module 104 does not necessarily have a physical boundary and components of the thermal heater module 104 may be distributed across the SoC 100 and components of the thermal heater module 104 may be dispersed among other components of the SoC 100 based on the layout of the components. Moreover, in addition to the processor 102, the SoC 100 may comprise many other components that may be turned off or have their functions suspended at low temperature, for example, memory, analog components and input/output (I/O) components. The processor 102 may be an example of the such components that may be turned off or suspended at the low temperature. In one embodiment, other components to be turned off or suspended at low temperature may also be controlled by the RESET signal from the temperature control logic 106. In some other embodiments, other components to be turned off or suspended at low temperature may be controlled by the processor 102. For example, the processor 102 may send a control signal to other components to suspend their operations before suspending its own functions.

Figure 2:
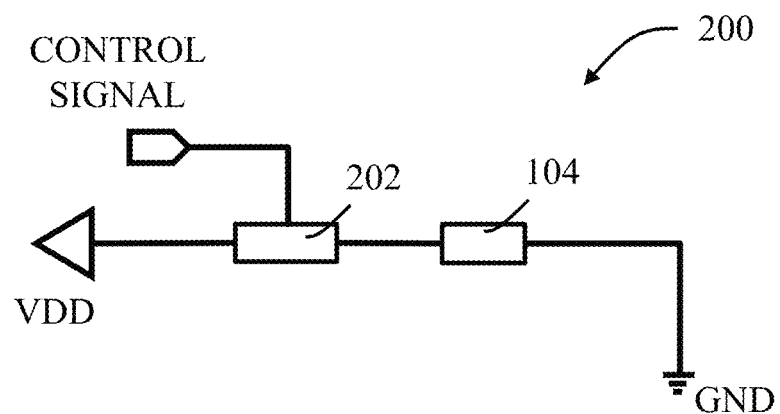
FIG. 2 schematically shows a thermal heater in accordance with an embodiment of the present disclosure.

FIG. 2 schematically shows a thermal heater 200 in accordance with an embodiment of the present disclosure. The thermal heater 200 may be an embodiment of the thermal heater 110. The thermal heater 200 may comprise a switch 202 and a heating element 204. The switch 202 may have one end coupled to a power source (e.g., VDD) and another end coupled to the heating element 204, and may be controlled by a control signal (e.g., from the thermal control logic 106) to turn on and off. For example, when the control signal is asserted (e.g., the thermal control logic 106 asserting the "Enable" signal), the switch 202 may be turned on, and when the control signal is not asserted (e.g., the thermal control logic 106 de-asserting the "Enable" signal), the switch 202 may be turned off. In one embodiment, the switch 202 may be a NMOS switch with its gate coupled to the control signal line from the thermal control logic 106 and the "Enable" signal may be an active logic high signal.

The heating element 204 may be a resistive structure and have one end coupled to a ground (e.g., GND) and another end coupled to the switch 202. When the switch 202 is turned on, electrical current may flow through the heating element 204 and heat may be generated by the heating element 204. In one embodiment, the heating element 204 may be a forward biased diode with its N end coupled to the ground (e.g., GND) and its P end coupled to the switch 202. The biased voltage may be controlled by the switch 202. In an embodiment in which the switch 202 is a NMOS switch, when the Enable signal is asserted high, the NMOS switch may be turned on, which in turn turns on the diode. The diode then conducts current and heats up its surrounding area. When the Enable signal is de-asserted, the NMOS switch turns off which shuts off the diode and the heater 200 is then effectively shut off.

Figure 3:
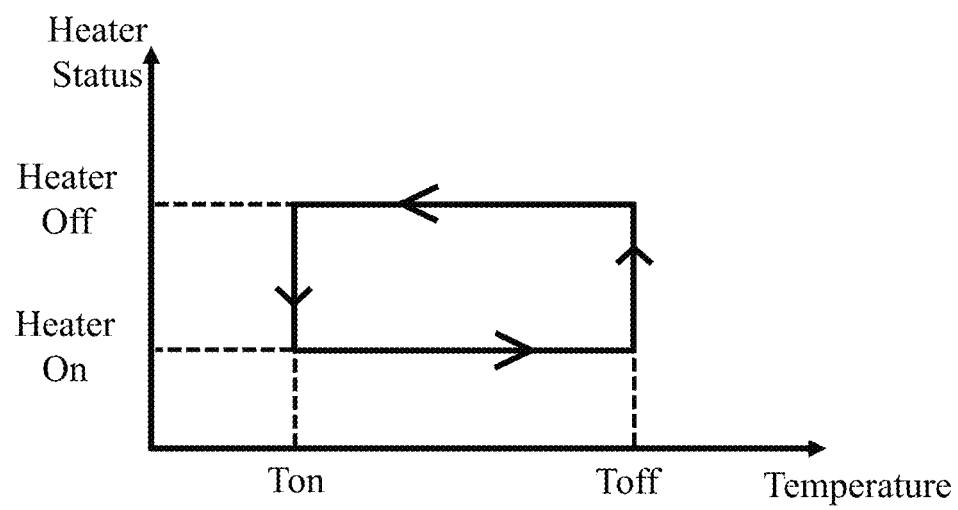
FIG. 3 schematically shows a hysteresis loop in accordance with an embodiment of the present disclosure.

FIG. 3 schematically shows a hysteresis loop in accordance with an embodiment of the present disclosure. The thermal control logic 106 may continuously receive temperature readouts from the temperature sensor 108. Based on the detected temperature, the thermal control logic 106 may adopt a hysteresis loop to control the thermal heater 110. As shown in FIG. 3, When the detected temperature drops to a temperature threshold value Ton, the thermal control logic 106 may turn on the thermal heater 110 to warm up the SoC 100. As the detected temperature rises up, the heater 110 may stay on until a higher temperature threshold Toff is reached. Once the temperature rises to reach Toff, the thermal heater 110 may be turned off by the thermal control logic 106 and stays off until the temperature drops to Ton. By having Toff>Ton, the thermal heater 110 may work according to the hysteresis loop as shown in FIG. 3. In some embodiments, the temperature threshold values Toff and Ton may have a decent temperature separation (e.g., 20° C. (degree Celsius)) for stable operation and sufficient error tolerance.

Figure 4:
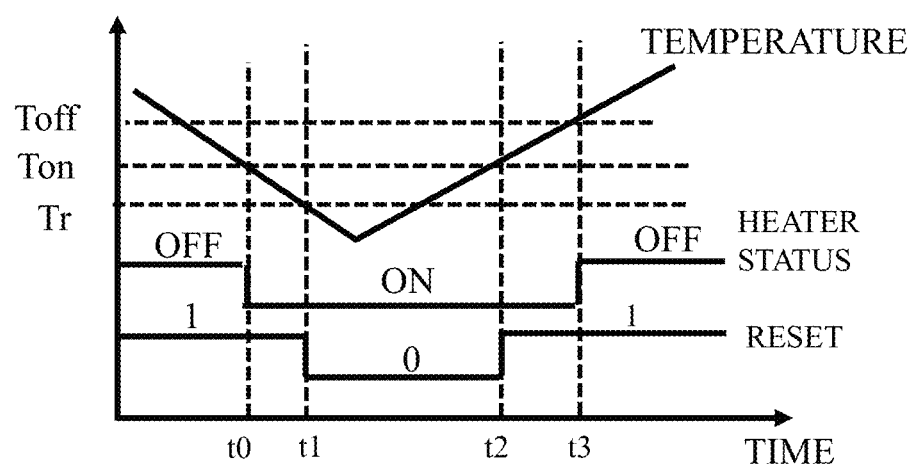
FIG. 4 schematically shows a reset control scheme in accordance with an embodiment of the present disclosure.

FIG. 4 schematically shows a control scheme in accordance with an embodiment of the present disclosure. When the thermal control logic 106 determines that the detected temperature lowers to reach the temperature threshold Ton at time t0, the heater 110 may be turned on. After the heater 110 is turned on at time t0, the temperature may continue to go down. When the thermal control logic 106 determines that the detected temperature lowers to reach the temperature threshold Tr at time t1, the RESET signal may be asserted to a logic zero (or LOW). The RESET signal line may be coupled to the processor 102 and the logic zero signal may trigger or cause the processor 102 to enter a reset state, in which regular functionality of the processor 102 may be suspended.

The temperature may start to go up after the heater 110 has been turned on for a little while as shown in FIG. 4. When the detected temperature goes up and reaches the threshold value Ton at time t2, the thermal control logic 106 may de-assert the RESET signal, e.g., setting to logic one (or HIGH). The logic one signal may trigger or cause the processor 102 to leave the reset state and resume its normal functions. At this time, the heater 110 may still be on and the temperature may keep going up. When the detected temperature rises to reach the threshold value Toff at time t3, the thermal control logic 106 may turn off the heater 110.

As shown in FIG. 4, the three threshold values may have this relationship: Tr<Ton<Toff. For example, Tr may be −10° C. (Degree Celsius or DC), Ton may be 0° C. and Toff may be 20° C. in an implementation. The heater 110 may be turned on before the circuit goes into RESET and there may be enough margin to prevent the circuit from going into RESET. With the Tr being a lowest threshold value, it may help to avoid the SoC constantly switching between RESET and normal states because of the heater tuning on and off. In one embodiment, the threshold levels, Toff, Ton and Tr may be programmable by firmware.

Figure 5:
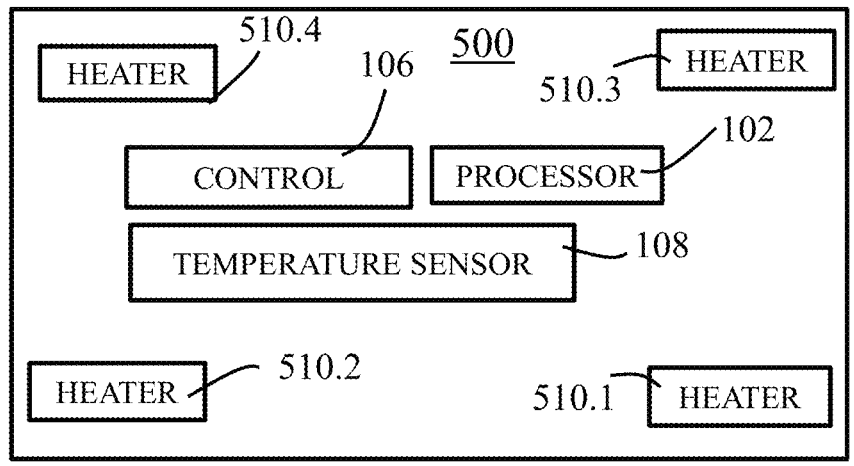
FIG. 5 schematically shows a floorplan of a system on a chip in accordance with an embodiment of the present disclosure.

FIG. 5 schematically shows a floorplan of a SoC 500 in accordance with an embodiment of the present disclosure. Embodiments of the SoC 100 may comprise a plurality of heaters. For example, to make the heating effective and uniform across the die of the SoC 100, a number of thermal heaters may be evenly placed across the SoC die area. The SoC 500 may be an embodiment of the SoC 100. As shown in FIG. 5, the SoC 500 may comprise a processor 102, a thermal control logic 106, a temperature sensor 108 and a plurality of heaters 510.1 through 510.4. Each of the heaters 510.1-510.4 may be an embodiment of the heater 200 of FIG. 2. The four thermal heaters 510.1-510.4 may be placed at the four corners of the SoC 500.

It should be noted that other number of thermal heaters may also be implemented in other embodiments and the thermal heaters may be placed evenly and uniformly across the SoC. Moreover, only the relevant units may be shown in FIG. 5 for illustration purpose, the SoC 500 may have some other common functional blocks not shown, such as, but not limited to, memory (e.g., SRAM) and analog components.

Figure 6:
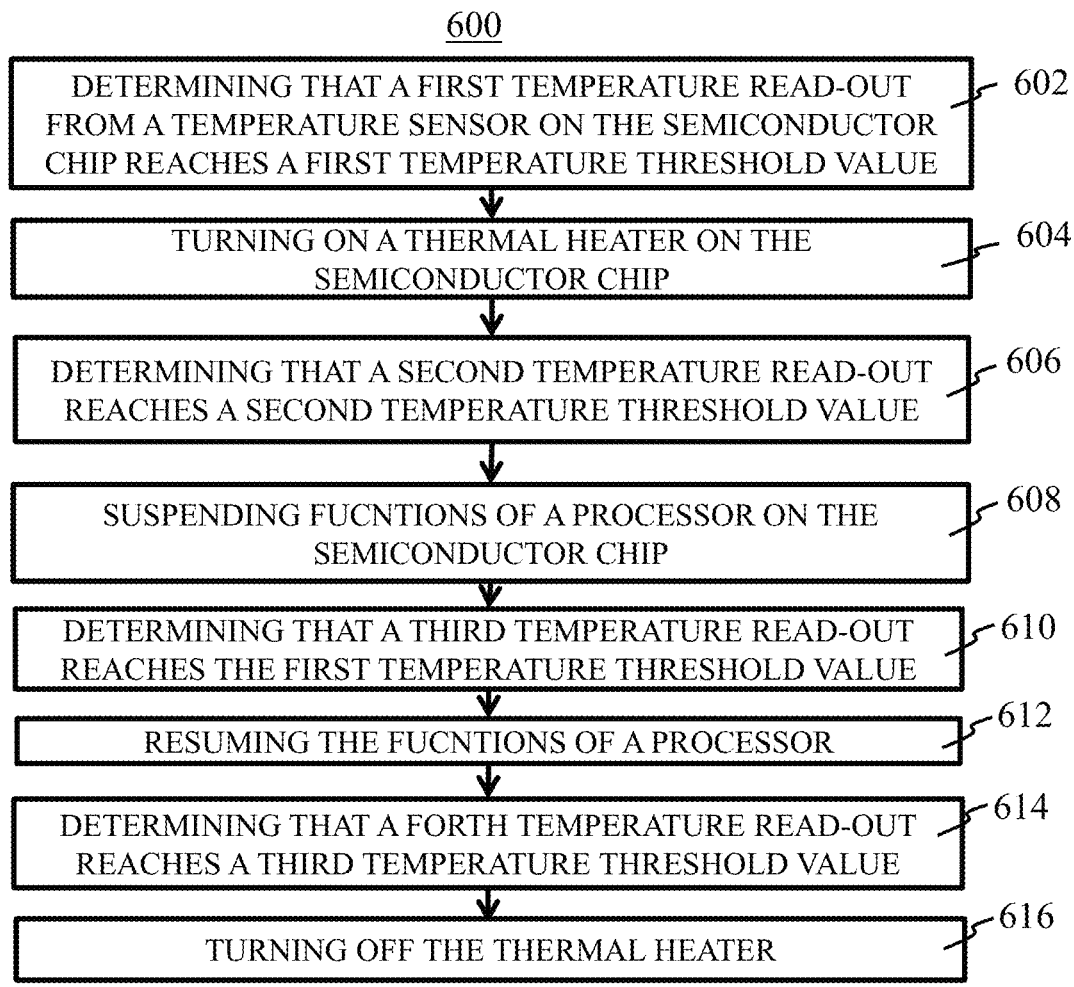
FIG. 6 is a flowchart of a thermal management process of a system on a chip in accordance with an embodiment of the present disclosure.

FIG. 6 is a flowchart of a thermal management process 600 for operating a system on a chip in accordance with an embodiment of the present disclosure. The process 600 may be implemented by the embodiments of the SoC 100. At block 602, a first temperature read-out from a temperature sensor on a semiconductor chip may be determined to have reached a first temperature threshold value. For example, the thermal control logic 106 may continuously receive temperature read-outs from the temperature sensor 108 and determine that, at the time t0 as shown in FIG. 4, the temperature has lowered to reach the temperature threshold value Ton. At block 604, a thermal heater on the semiconductor chip may be turned on. For example, when the temperature detected by the temperature sensor 108 has reached the threshold value Ton, the thermal control logic 106 may turn on a switch in the thermal heater 110 to turn on the thermal heater 110.

At block 606, a second temperature read-out from the temperature sensor may be determined to have lowered to reach a second temperature threshold value that is lower than the first temperature threshold value. For example, the thermal control logic 106 may continuously receive temperature read-outs from the temperature sensor 108 and determine that, at the time t1 as shown in FIG. 4, the temperature has lowered to reach the temperature threshold value Tr. In one embodiment, the temperature threshold value Tr may be lower than the first temperature threshold value (e.g., by at least 10 degrees Celsius). At block 608, functions of a processor on the semiconductor chip may be suspended. In one embodiment, the thermal control logic 106 may assert the RESET signal to the processor 102 to bring the processor 102 into a RESET state, in which the functionality of the processor 102 may be suspended.

At block 610, a third temperature read-out from the temperature sensor may be determined to have reached the first temperature threshold value. For example, the thermal control logic 106 may further continuously receive temperature read-outs from the temperature sensor 108 and determine that, at the time t2 as shown in FIG. 4, the temperature has risen to reach the temperature threshold value Ton. At block 612, the functions of the processor may be resumed. In one embodiment, the thermal control logic 106 may de-assert the RESET signal to the processor 102 to let the processor 102 leave the RESET state and resume its normal functions.

At block 614, a fourth temperature read-out from the temperature sensor may be determined to have reached a third temperature threshold value that is higher than the first temperature threshold value. For example, the thermal control logic 106 may further continuously receive temperature read-outs from the temperature sensor 108 and determine that, at the time t3 as shown in FIG. 4, the temperature has risen to reach the temperature threshold value Toff. In one embodiment, the temperature threshold value Toff may be higher than the first temperature threshold value (e.g., by at least 20 degrees Celsius). At block 616, the thermal heater may be turned off. For example, when the temperature detected by the temperature sensor 108 has reached the threshold value Toff, the thermal control logic 106 may turn off the switch in the thermal heater 110 to turn off the thermal heater 110.

One exemplary embodiment according to the present disclosure may provide a semiconductor chip that may comprise a temperature sensor, a thermal heater, a processor and thermal control logic. The thermal control logic may comprise circuitry configured to: determine that a first temperature read-out from the temperature sensor reaches a first temperature threshold value, turn on the thermal heater, determine that a second temperature read-out from the temperature sensor reaches a second temperature threshold value that is lower than the first temperature threshold value, suspend functions of the processor, determine that a third temperature read-out from the temperature sensor reaches the first temperature threshold value, resume the functions of the processor, determine that a fourth temperature read-out from the temperature sensor reaches a third temperature threshold value that is higher than the first temperature threshold value and turn off the thermal heater.

In one embodiment, the thermal control logic may be configured to suspend the functions of the processor by asserting a signal to the processor and resume the functions of the processor by de-asserting the signal to the processor.

In one embodiment, the signal may be asserted to a logic low to suspend the functions of the processor.

In one embodiment, the thermal heater may comprise a switch and a resistive structure, and the thermal control logic may be configured to turn on the thermal heater by asserting a control signal to the switch to turn on the switch and turn off the thermal heater by de-asserting the control signal to the switch to turn off the switch.

In one embodiment, the resistive structure may be a forward biased diode and the switch is a NMOS, and the forward biased diode's biased voltage may be controlled by the NMOS.

In one embodiment, the thermal heater may be one of a plurality of thermal heaters evenly placed on a die of the semiconductor chip.

In one embodiment, the first temperature threshold value, the second temperature threshold value and the third temperature threshold value may be programmable by firmware.

In one embodiment, the semiconductor may further comprise a memory and an input/output whose functions may be also suspended when the functions of the processor is suspended.

In one embodiment, the thermal control logic may be further configured to send a plurality of control signals to the temperature sensor to configurate and calibrate the temperature sensor.

In one embodiment, the processor may be configured to configure the thermal control logic by sending control and command signals to the thermal control logic.

In another exemplary embodiment, there is provide a method for operating a semiconductor chip. The method may comprise determining that a first temperature read-out from a temperature sensor on the semiconductor chip reaches a first temperature threshold value, turning on a thermal heater on the semiconductor chip, determining that a second temperature read-out from the temperature sensor reaches a second temperature threshold value that is lower than the first temperature threshold value, suspending functions of a processor on the semiconductor chip, determine that a third temperature read-out from the temperature sensor reaches the first temperature threshold value, resuming the functions of the processor, determining that a fourth temperature read-out from the temperature sensor reaches a third temperature threshold value that is higher than the first temperature threshold value and turning off the thermal heater.

In one embodiment, suspending the functions of the processor may comprise asserting a signal to the processor and resuming the functions of the processor may comprise de-asserting the signal to the processor.

In one embodiment, the signal may be asserted to a logic low to suspend the functions of the processor.

In one embodiment, the thermal heater may comprise a switch and a resistive structure, and turning on the thermal heater may comprise asserting a control signal to the switch to turn on the switch and turning off the thermal heater may comprise de-asserting the control signal to the switch to turn off the switch.

In one embodiment, the resistive structure may be a forward biased diode and the switch may be a NMOS, and the forward biased diode's biased voltage may be controlled by the NMOS.

In one embodiment, the thermal heater may be one of a plurality of thermal heaters evenly placed on a die of the semiconductor chip.

In one embodiment, the first temperature threshold value, the second temperature threshold value and the third temperature threshold value may be programmable by firmware.

In one embodiment, the semiconductor chip may further comprise a memory and an input/output whose functions are also suspended when the functions of the processor is suspended.

In one embodiment, the method may further comprise sending a plurality of control signals to the temperature sensor to configurate and calibrate the temperature sensor.

In one embodiment, the method may further comprise configuring thermal control logic of the semiconductor chip by sending control and command signals from the processor to the thermal control logic.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The terms chip, die, integrated circuit, monolithic device, semiconductor device, and microelectronic device are often used interchangeably in the microelectronics field. The present invention is applicable to all of the above as they are generally understood in the field.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:
1. A semiconductor chip, comprising:
a temperature sensor;

a thermal heater;
a processor; and
thermal control logic comprising circuitry configured to:
determine that a first temperature read-out from the temperature sensor reaches a first temperature threshold value;
turn on the thermal heater;
determine that a second temperature read-out from the temperature sensor reaches a second temperature threshold value that is lower than the first temperature threshold value;
suspend functions of the processor;
determine that a third temperature read-out from the temperature sensor reaches the first temperature threshold value;
resume the functions of the processor;
determine that a fourth temperature read-out from the temperature sensor reaches a third temperature threshold value that is higher than the first temperature threshold value; and
turn off the thermal heater.

2. The semiconductor chip of claim 1, wherein the thermal control logic is configured to suspend the functions of the processor by asserting a signal to the processor and resume the functions of the processor by de-asserting the signal to the processor.

3. The semiconductor chip of claim 2, wherein the signal is asserted to a logic low to suspend the functions of the processor.

4. The semiconductor chip of claim 1, wherein the thermal heater comprises a switch and a resistive structure, and the thermal control logic is configured to turn on the thermal heater by asserting a control signal to the switch to turn on the switch and turn off the thermal heater by de-asserting the control signal to the switch to turn off the switch.

5. The semiconductor chip of claim 4, wherein the resistive structure is a forward biased diode and the switch is a NMOS, and the forward biased diode's biased voltage is controlled by the NMOS.

6. The semiconductor chip of claim 5, wherein the thermal heater is one of a plurality of thermal heaters evenly placed on a die of the semiconductor chip.

7. The semiconductor chip of claim 1, wherein the first temperature threshold value, the second temperature threshold value and the third temperature threshold value are programmable by firmware.

8. The semiconductor chip of claim 1, further comprising a memory and an input/output whose functions are also suspended when the functions of the processor is suspended.

9. The semiconductor chip of claim 1, wherein the thermal control logic is further configured to send a plurality of control signals to the temperature sensor to configurate and calibrate the temperature sensor.

10. The semiconductor chip of claim 1, wherein the processor is configured to configure the thermal control logic by sending control and command signals to the thermal control logic.

11. A method of operating a semiconductor chip, comprising:
determining that a first temperature read-out from a temperature sensor on the semiconductor chip reaches a first temperature threshold value;
turning on a thermal heater on the semiconductor chip;
determining that a second temperature read-out from the temperature sensor reaches a second temperature threshold value that is lower than the first temperature threshold value;
suspending functions of a processor on the semiconductor chip;
determine that a third temperature read-out from the temperature sensor reaches the first temperature threshold value;
resuming the functions of the processor;
determining that a fourth temperature read-out from the temperature sensor reaches a third temperature threshold value that is higher than the first temperature threshold value; and
turning off the thermal heater.

12. The method of claim 11, wherein suspending the functions of the processor comprises asserting a signal to the processor and resuming the functions of the processor comprises de-asserting the signal to the processor.

13. The method of claim 12, wherein the signal is asserted to a logic low to suspend the functions of the processor.

14. The method of claim 11, wherein the thermal heater comprises a switch and a resistive structure, and turning on the thermal heater comprises asserting a control signal to the switch to turn on the switch and turning off the thermal heater comprises de-asserting the control signal to the switch to turn off the switch.

15. The method of claim 14, wherein the resistive structure is a forward biased diode and the switch is a NMOS, and the forward biased diode's biased voltage is controlled by the NMOS.

16. The method of claim 15, wherein the thermal heater is one of a plurality of thermal heaters evenly placed on a die of the semiconductor chip.

17. The method of claim 11, wherein the first temperature threshold value, the second temperature threshold value and the third temperature threshold value are programmable by firmware.

18. The method of claim 11, wherein the semiconductor chip further comprises a memory and an input/output whose functions are also suspended when the functions of the processor is suspended.

19. The method of claim 11, further comprising sending a plurality of control signals to the temperature sensor to configurate and calibrate the temperature sensor.

20. The method of claim 11, further comprising configuring thermal control logic by sending control and command signals from the processor to the thermal control logic.

* * * * *